(12) United States Patent
Okabe et al.

(10) Patent No.: US 12,527,181 B2
(45) Date of Patent: Jan. 13, 2026

(54) DISPLAY DEVICE HAVING ROUTING WIRES EXTENDING IN A BENDING SECTION BETWEEN A DISPLAY AREA AND A TERMINAL SECTION

(71) Applicant: SHARP KABUSHIKI KAISHA, Sakai (JP)

(72) Inventors: Tohru Okabe, Sakai (JP); Shoji Okazaki, Sakai (JP); Shinsuke Saida, Sakai (JP); Shinji Ichikawa, Sakai (JP); Hiroki Taniyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 384 days.

(21) Appl. No.: 18/028,493

(22) PCT Filed: Sep. 28, 2020

(86) PCT No.: PCT/JP2020/036700
§ 371 (c)(1),
(2) Date: Mar. 24, 2023

(87) PCT Pub. No.: WO2022/064710
PCT Pub. Date: Mar. 31, 2022

(65) Prior Publication Data
US 2023/0337486 A1 Oct. 19, 2023

(51) Int. Cl.
*H10K 59/131* (2023.01)
*H10K 59/80* (2023.01)
*H10K 102/00* (2023.01)

(52) U.S. Cl.
CPC ......... *H10K 59/131* (2023.02); *H10K 59/871* (2023.02); *H10K 2102/311* (2023.02)

(58) Field of Classification Search
CPC .......................... H01K 59/131; H10K 59/871
See application file for complete search history.

(56) References Cited

U.S. PATENT DOCUMENTS

| RE49,052 E | 4/2022 | Youn et al. |
| 2014/0078458 A1 | 3/2014 | Fukushima |

(Continued)

FOREIGN PATENT DOCUMENTS

| CN | 111433929 A | 7/2020 |
| JP | 2014232300 A | 12/2014 |

(Continued)

*Primary Examiner* — Michael Jung
(74) *Attorney, Agent, or Firm* — ScienBiziP, P.C.

(57) ABSTRACT

A display device includes: a resin substrate layer; a thin film transistor layer on the resin substrate layer, the thin film transistor layer including a sequential stack of an inorganic insulating film, a wiring layer, and a planarization film; and a light-emitting element layer, wherein a frame area is provided, a terminal section is provided, a bending section is provided between the display area and the terminal section, a plurality of routing wires are provided in the bending section and two sides of the bending section, and at least one of the plurality of routing wires includes: a display-side wiring section on an edge portion of the inorganic insulating film; a terminal-side wiring section on another edge portion of the inorganic insulating film; and an intermediate wiring section electrically connected to the display-side wiring section and the terminal-side wiring section respectively.

20 Claims, 8 Drawing Sheets

(56) References Cited

U.S. PATENT DOCUMENTS

| | | | |
|---|---|---|---|
| 2014/0353670 | A1 | 12/2014 | Youn et al. |
| 2015/0287750 | A1 | 10/2015 | Youn et al. |
| 2015/0372253 | A1* | 12/2015 | Hong .................. H10K 50/841 |
| | | | 257/40 |
| 2019/0041915 | A1* | 2/2019 | Park .................... H10K 77/111 |
| 2019/0096975 | A1* | 3/2019 | Park .................... H10K 59/1213 |
| 2020/0219423 | A1 | 7/2020 | Okabe et al. |
| 2020/0273380 | A1 | 8/2020 | Ichikawa et al. |

FOREIGN PATENT DOCUMENTS

| | | |
|---|---|---|
| KR | 20170106621 A | 9/2017 |
| WO | 2012176417 A1 | 12/2012 |
| WO | 2019064365 A1 | 4/2019 |

* cited by examiner

DISPLAY DEVICE HAVING ROUTING WIRES EXTENDING IN A BENDING SECTION BETWEEN A DISPLAY AREA AND A TERMINAL SECTION

TECHNICAL FIELD

The disclosure relates to display devices.

BACKGROUND ART

The organic EL display device, or the self-luminous display device built around organic electroluminescence elements (hereinafter, may be referred to as "organic EL elements"), has been attracting attention as a promising successor to the liquid crystal display device. Some flexible organic EL display devices are being proposed that include a flexible resin substrate layer carrying thereon organic EL elements and other related components. The organic EL display device has a display area for displaying images and a frame area surrounding the display area. There is a demand to reduce the frame area ("narrow frame"). If the frame area is bent to reduce the area occupied by the frame area in a plan view of the flexible organic EL display device, the wiring in the frame area could break.

As an example, Patent Literature 1 discloses a flexible display device including bending holes. A buffer film, a gate insulating film, and an interlayer insulating film are partially removed in a location corresponding to the bending region to prevent breaks in the wiring.

CITATION LIST

Patent Literature

Patent Literature 1: Japanese Unexamined Patent Application Publication, Tokukai, No. 2014-232300

SUMMARY

Technical Problem

The flexible organic EL display device includes inorganic insulating films such as a base coat film, a gate insulating film, and an interlayer insulating film on a resin substrate layer. It is suggested that breaks in routing wires in the frame area would be prevented by removing the inorganic insulating films in a bending section of the frame area, substituting a planarization film in a location where the inorganic insulating films have been removed, and then forming routing wires on the planarization film. In this structure, the planarization film is essential in providing a cover over the edge portions of the partially removed inorganic insulating films to restrain breaks in the routing wires. The planarization film is however made of a relatively costly material and it adds to the manufacturing cost to provide the planarization film only in the bending section. The flexible organic EL display device hence has room for improvement.

In view of these issues, it is an object of the disclosure to restrain breaks in routing wires caused by the edge portions of the inorganic insulating films near the bending section.

Solution to Problem

To achieve the object, a display device in accordance with the disclosure includes: a resin substrate layer; a thin film transistor layer on the resin substrate layer, the thin film transistor layer including a sequential stack of an inorganic insulating film, a wiring layer, and a planarization film; and a light-emitting element layer on the thin film transistor layer, the light-emitting element layer including a sequential stack of a plurality of first electrodes, a plurality of light-emitting functional layers, and a common, second electrode in such a manner as to correspond to a plurality of subpixels in a display area, wherein a frame area is provided around the display area, a terminal section is provided on an end region of the frame area, a bending section is provided extending in one direction between the display area and the terminal section, the inorganic insulating film has a slit extending through the inorganic insulating film in the bending section in a direction in which the bending section extends, to expose a surface of the resin substrate layer, the planarization film is provided in the bending section to fill the slit, a plurality of routing wires are provided extending, in the bending section and two sides of the bending section, parallel to each other in a direction that intersects with the direction in which the bending section extends, and at least one of the plurality of routing wires includes: a display-side wiring section on an edge portion of the inorganic insulating film that is on a display area side of the inorganic insulating film, the display-side wiring section being made of a same material, and provided in a same layer, as the wiring layer; a terminal-side wiring section on another edge portion of the inorganic insulating film that is on a terminal section side of the inorganic insulating film, the terminal-side wiring section being made of a same material, and provided in a same layer, as the wiring layer; and an intermediate wiring section electrically connected to the display-side wiring section and the terminal-side wiring section respectively via a first contact hole and a second contact hole both formed through the planarization film.

Advantageous Effects of Disclosure

The disclosure is capable of restraining breaks in routing wires caused by the edge portions of the inorganic insulating films near the bending section.

DESCRIPTION OF EMBODIMENTS

The following will describe embodiments of the disclosure in detail with reference to drawings. The disclosure is by no means limited to these embodiments.

First Embodiment

Figure 1:
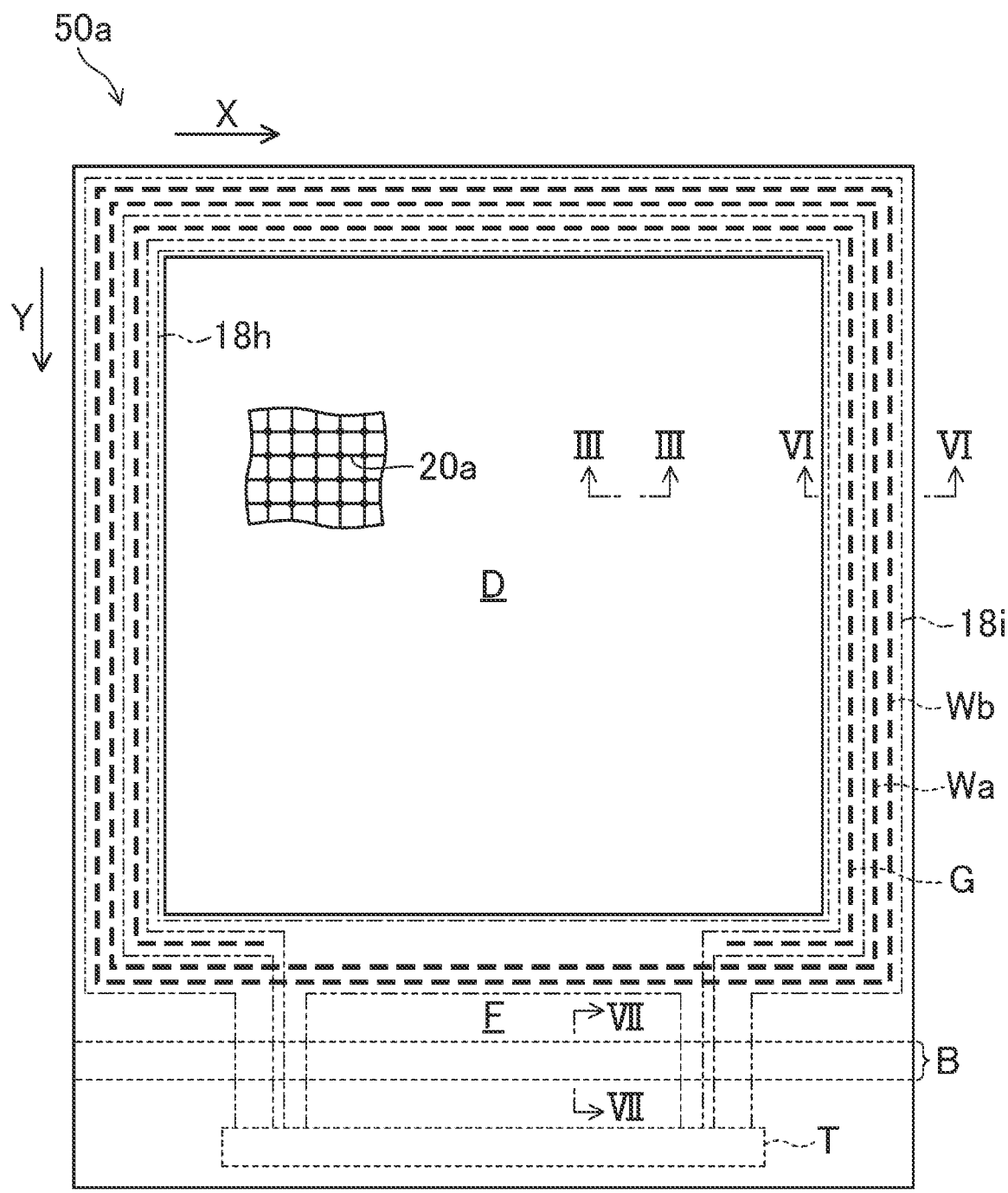
FIG. 1 is a schematic plan view of a structure of an organic EL display device in accordance with a first embodiment of the disclosure.
Figure 2:
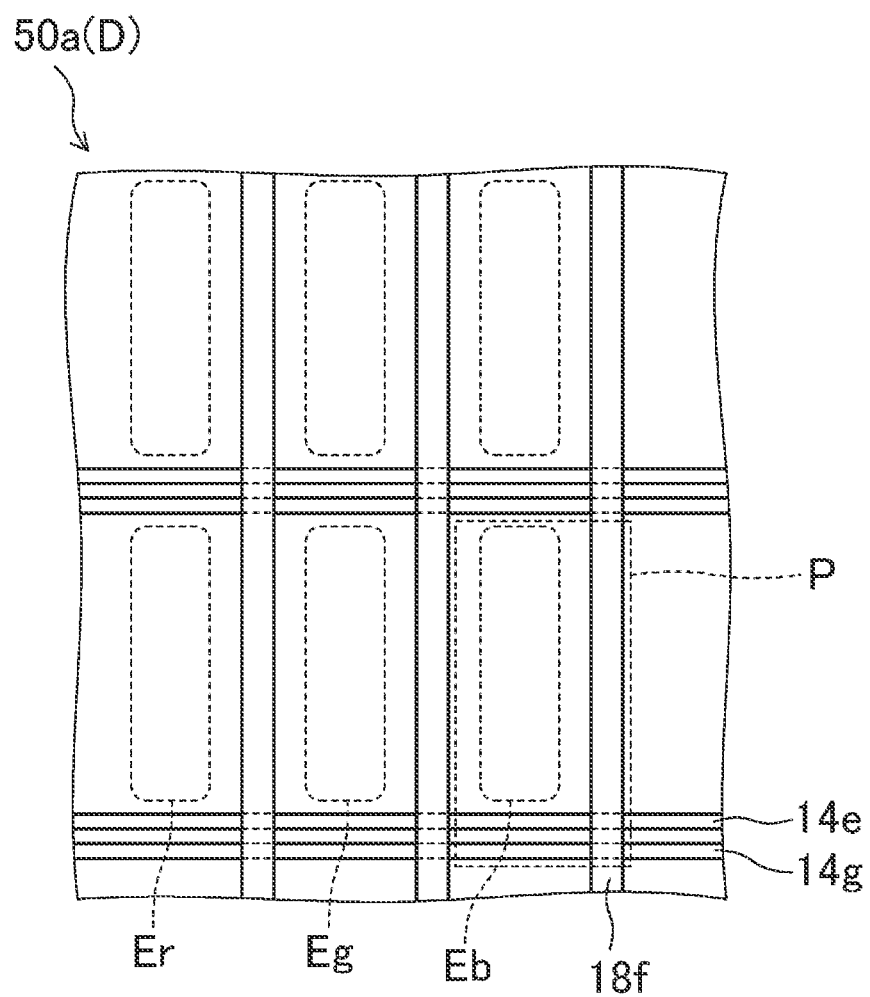
FIG. 2 is a plan view of a display area of the organic EL display device in accordance with the first embodiment of the disclosure.
Figure 3:
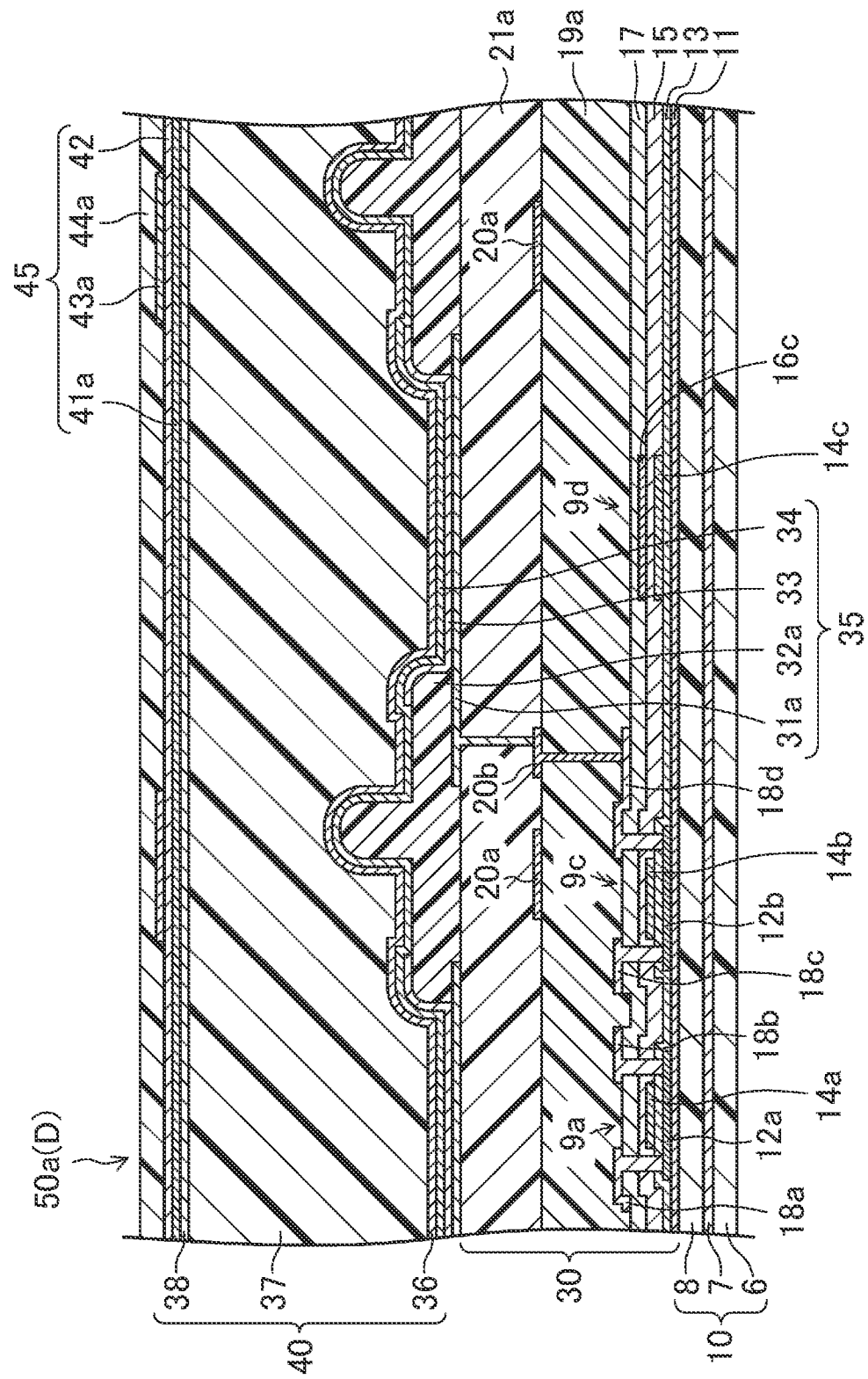
FIG. 3 is a cross-sectional view of the display area of the organic EL display device, taken along line III-III shown in FIG. 1.
Figure 4:
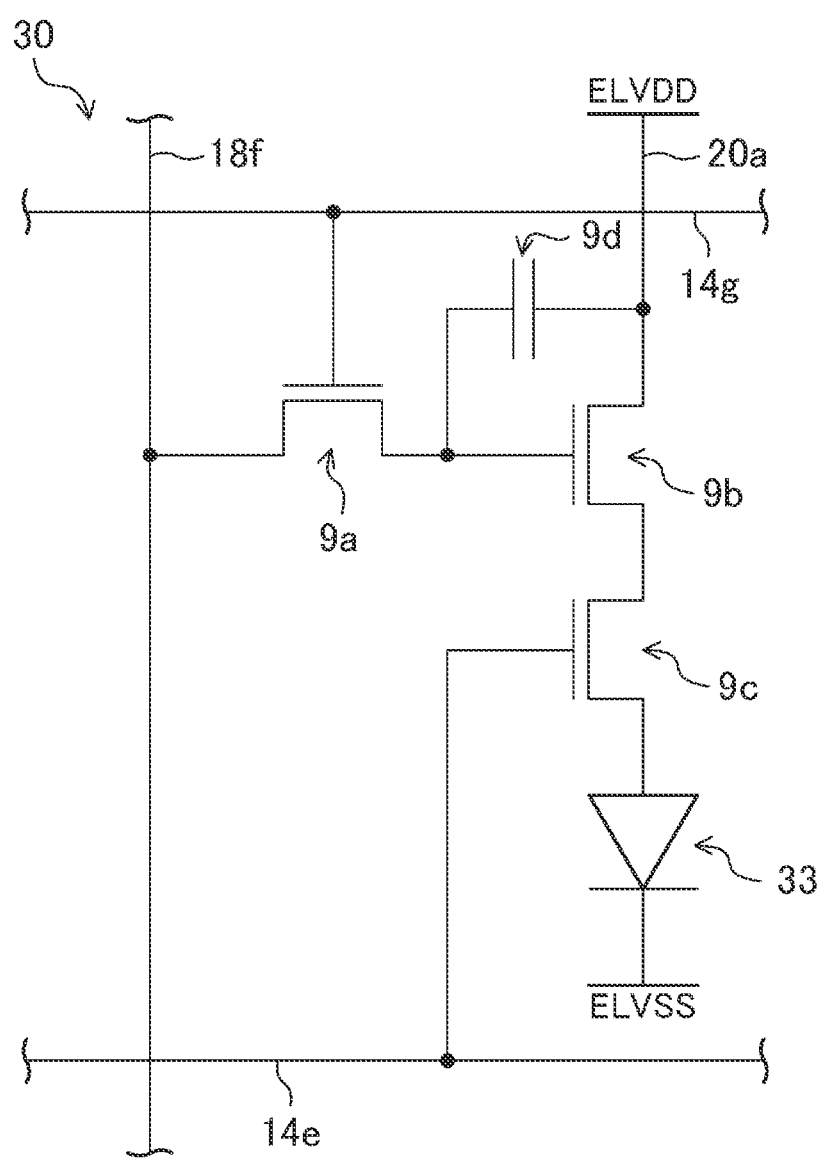
FIG. 4 is an equivalent circuit diagram of a thin film transistor layer in the organic EL display device in accordance with the first embodiment of the disclosure.
Figure 5:
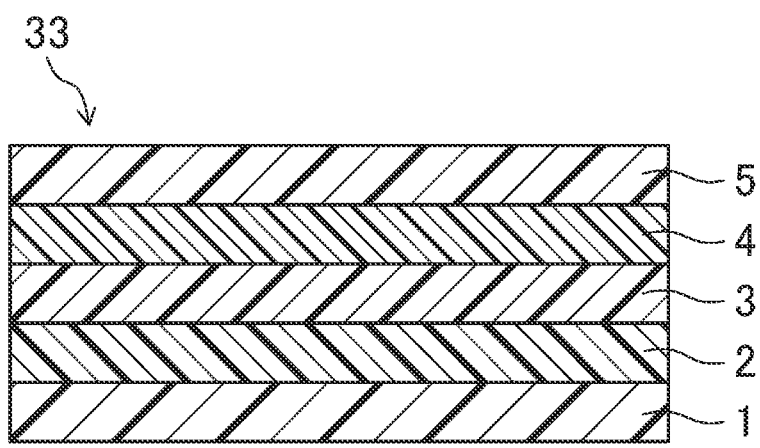
FIG. 5 is a cross-sectional view of an organic EL layer in the organic EL display device in accordance with the first embodiment of the disclosure.
Figure 6:
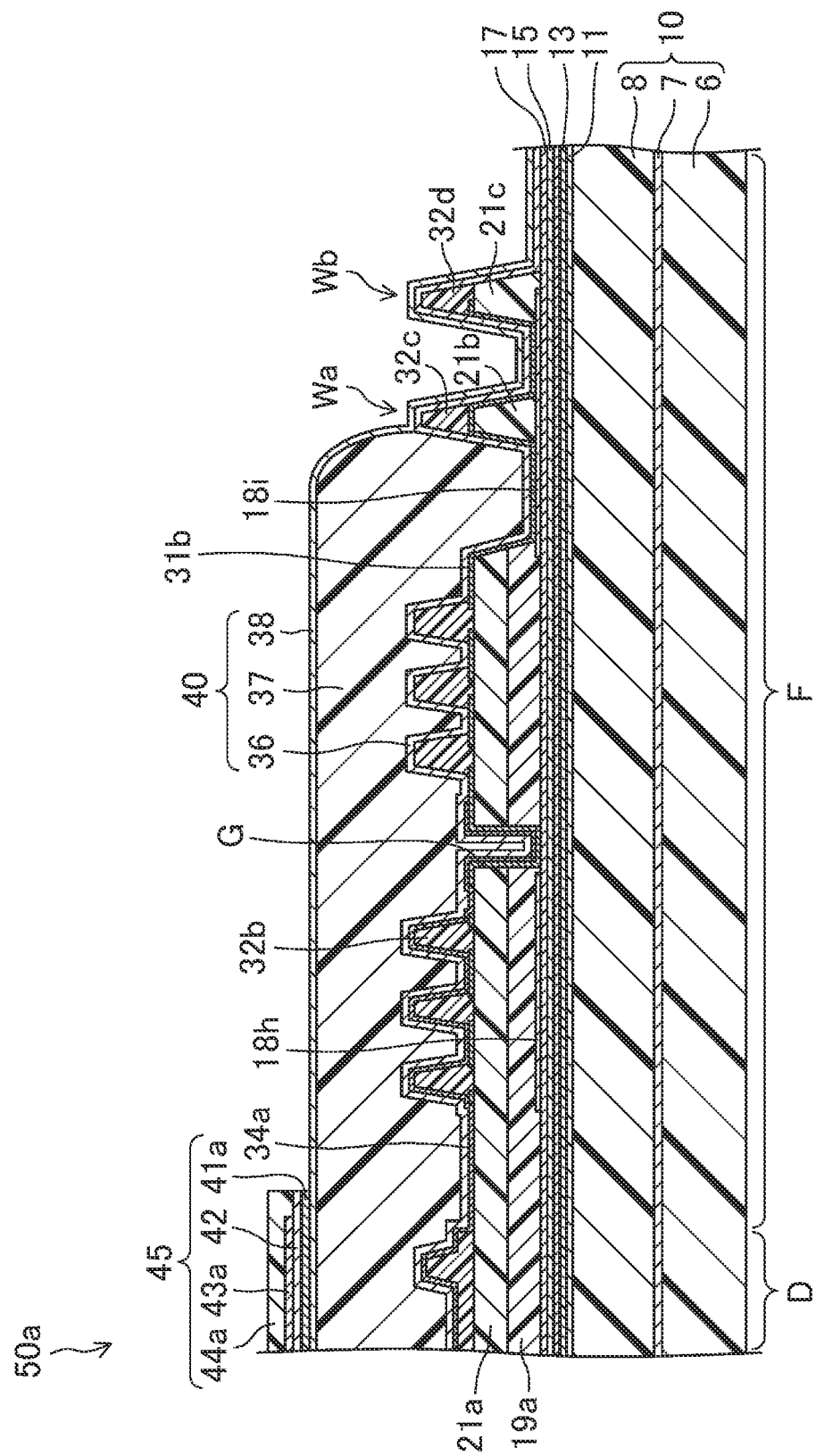
FIG. 6 is a cross-sectional view of the organic EL display device, taken along line VI-VI shown in FIG. 1.
Figure 7:
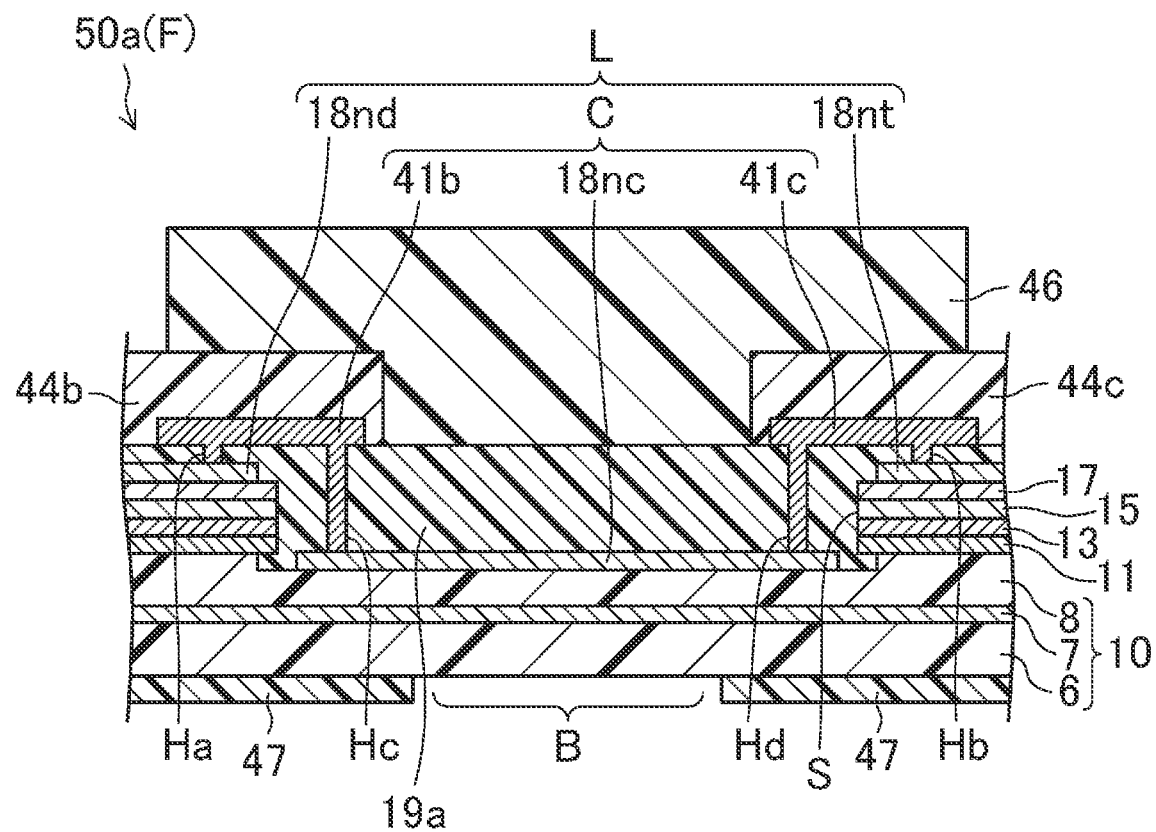
FIG. 7 is a cross-sectional view of a frame area of the organic EL display device, taken along line VII-VII shown in FIG. 1.

FIGS. 1 to 7 depict a first embodiment of a display device in accordance with the disclosure. Each embodiment below will discuss an organic EL display device including an organic EL element layer as an example of a display device including a light-emitting element layer. FIG. 1 is a schematic plan view of a structure of an organic EL display device 50a in accordance with the present embodiment. FIG. 2 is a plan view of a display area D of the organic EL display device 50a. FIG. 3 is a cross-sectional view of the display area D of the organic EL display device 50a, taken along line III-III shown in FIG. 1. FIG. 4 is an equivalent circuit diagram of a thin film transistor layer 30 in the organic EL display device 50a. FIG. 5 is a cross-sectional view of an organic EL layer 33 in the organic EL display device 50a. FIG. 6 is a cross-sectional view of the organic EL display device 50a, taken along line VI-VI shown in FIG. 1. FIG. 7 is a cross-sectional view of a frame area F of the organic EL display device 50a, taken along line VII-VII shown in FIG. 1.

The organic EL display device 50a has, for example, the rectangular display area D for displaying images and the frame area F shaped like a frame surrounding the display area D, as shown in FIG. 1. The present embodiment gives the rectangular display area D as an example. This rectangular shape encompasses, for example, generally rectangular shapes such as those with a curved side(s), those with a round corner(s), and those with a notched side(s).

There is provided a matrix of subpixels P in the display area D as shown in FIG. 2. In the display area D, for example, a subpixel P including a red-light-emission region Er for a display in red, a subpixel P including a green-light-emission region Eg for a display in green, and a subpixel P including a blue-light-emission region Eb for a display in blue are provided adjacent to each other as shown in FIG. 2. Each pixel in the display area D is formed by, for example, three adjacent subpixels P including the red-light-emission region Er, the green-light-emission region Eg, and the blue-light-emission region Eb respectively.

As shown in FIG. 1, the frame area F includes, along the bottom end thereof, a terminal section T extending in one direction (in the X-direction in the drawing). The frame area F further includes a bending section B extending in one direction (in the X-direction in the drawing) between the display area D and the terminal section T as shown in FIG. 1. The bending section B can be bent, for example, 180° around the X-direction (to form a U-shape). The frame area F has a trench G through a first planarization film 19a and a second planarization film 21a, both of which will be described later in detail, as shown in FIGS. 1 and 6. The trench G is shaped generally like a letter C in a plan view with an opening facing the terminal section T in a plan view as shown in FIG. 1.

The organic EL display device 50a includes: a resin substrate layer 10; the thin film transistor (hereinafter, may be referred to as "TFT") layer 30 on the resin substrate layer 10; an organic EL element layer 35 as a light-emitting element layer on a TFT layer 30; a sealing film 40 covering the organic EL element layer 35; and a touch panel layer 45 on the sealing film 40, as shown in FIG. 3.

The resin substrate layer 10 includes: a first resin substrate layer 6 opposite the TFT layer 30; a second resin substrate layer 8 on the same side as the TFT layer 30; and an intra-substrate inorganic insulating film 7 between the first resin substrate layer 6 and the second resin substrate layer 8, as shown in FIGS. 3, 6, and 7. The first resin substrate layer 6 and the second resin substrate layer 8 are made of, for example, a polyimide resin. In addition, the intra-substrate inorganic insulating film 7, as well as a base coat film 11, a gate insulating film 13, a first interlayer insulating film 15, a second interlayer insulating film 17, and a third interlayer insulating film 42, all of which will be described later in detail, includes, for example, either a monolayer film of an inorganic insulating material, for example, silicon nitride, silicon oxide, or silicon oxynitride or a stack of any of these inorganic insulating films.

The TFT layer 30, as shown in FIG. 3, includes: the base coat film 11 on the resin substrate layer 10; a plurality of first TFTs 9a, a plurality of second TFTs 9b (see FIG. 4), a plurality of third TFTs 9c, and a plurality of capacitors 9d all on the base coat film 11; and the first planarization film 19a and the second planarization film 21a sequentially disposed on each of the first TFTs 9a, each of the second TFTs 9b, each of the third TFTs 9c, and each of the capacitors 9d.

The TFT layer 30, as shown in FIG. 3, includes, on the resin substrate layer 10, a sequential stack of: the base coat film 11; a patterned semiconductor layer such as a semiconductor layer 12a (detailed later); the gate insulating film 13; a first wiring layer including gate lines 14g (detailed later); the first interlayer insulating film 15; a second wiring layer including an upper conductive layer 16c (detailed later); the second interlayer insulating film 17; a third wiring layer including source lines 18f (detailed later); the first planarization film 19a; a fourth wiring layer including power supply lines 20a; and the second planarization film 21a.

The TFT layer 30 includes, as the first wiring layer, the plurality of gate lines 14g extending parallel to each other in the lateral direction in the drawing as shown in FIGS. 2 and 4. The TFT layer 30 further includes, as the first wiring layer, a plurality of light-emission control lines 14e extending parallel to each other in the lateral direction in the drawing as shown in FIGS. 2 and 4. Note that the light-emission control lines 14e are disposed adjacent to the respective gate lines 14g as shown in FIG. 2. The TFT layer 30 further includes, as the third wiring layer, the plurality of source lines 18f extending parallel to each other in the vertical direction in the drawing as shown in FIGS. 2 and 4. The TFT layer 30 further includes, as the fourth wiring layer, the power supply lines 20a that forms a lattice between the first planarization film 19a and the second planarization film 21a as shown in FIGS. 1 and 3. Additionally, in the TFT layer 30, each subpixel P includes one of the first TFTs 9a, one of the second TFTs 9b, one of the third TFTs 9c, and one of the capacitors 9d as shown in FIG. 4.

In each subpixel P, the first TFT 9a is electrically connected to an associated one of the gate lines 14g, an associated one of the source lines 18f, and an associated one of the second TFTs 9b as shown in FIG. 4. The first TFT 9a includes the semiconductor layer 12a, the gate insulating film 13, a gate electrode 14a, the first interlayer insulating film 15, the second interlayer insulating film 17, and a source electrode 18a and a drain electrode 18b, all of which are sequentially disposed on the base coat film 11, as shown in FIG. 3. The semiconductor layer 12a is provided insularly on the base coat film 11 and has a channel region, a source region, and a drain region (detailed later) as shown in FIG. 3. The gate insulating film 13 is disposed covering the semiconductor layer 12a as shown in FIG. 3. The gate electrode 14a is disposed overlapping the channel region in the semiconductor layer 12a on the gate insulating film 13 as shown in FIG. 3. The first interlayer insulating film 15 and the second interlayer insulating film 17 are sequentially disposed covering the gate electrode 14a as shown in FIG. 3. The source electrode 18a and the drain electrode 18b are disposed at a distance from each other on the second interlayer insulating film 17 as shown in FIG. 3. The source electrode 18a and the drain electrode 18b are electrically connected respectively to the source region and the drain region in the semiconductor layer 12a via contact holes formed through the stack of the gate insulating film 13, the first interlayer insulating film 15, and the second interlayer insulating film 17 as shown in FIG. 3.

In each subpixel P, the second TFT 9b is electrically connected to an associated one of the first TFTs 9a, an associated one of the power supply lines 20a, and an associated one of the third TFTs 9c as shown in FIG. 4. The second TFT 9b has substantially the same structure as the first TFT 9a and the third TFT 9c (detailed later).

The third TFT 9c, in each subpixel P, is electrically connected to an associated one of the second TFTs 9b, (an associated one of first electrodes 31a contacted to) the organic EL layer 33 (detailed later), and an associated one of the light-emission control lines 14e as shown in FIG. 4. The third TFT 9c includes: a semiconductor layer 12b, the gate insulating film 13, a gate electrode 14b, the first interlayer insulating film 15, the second interlayer insulating film 17, and a source electrode 18c and a drain electrode 18d, all of which are sequentially disposed on the base coat film 11, as shown in FIG. 3. The semiconductor layer 12b is provided insularly on the base coat film 11 and has a channel region, a source region, and a drain region similarly to the semiconductor layer 12a as shown in FIG. 3. The gate insulating film 13 is disposed covering the semiconductor layer 12b as shown in FIG. 3. The gate electrode 14b is disposed overlapping the channel region in the semiconductor layer 12b on the gate insulating film 13 as shown in FIG. 3. The first interlayer insulating film 15 and the second interlayer insulating film 17 are sequentially disposed covering the gate electrode 14b as shown in FIG. 3. The source electrode 18c and the drain electrode 18d are disposed at a distance from each other on the second interlayer insulating film 17 as shown in FIG. 3. The source electrode 18c and the drain electrode 18d are electrically connected respectively to the source region and the drain region in the semiconductor layer 12b via contact holes formed through the stack of the gate insulating film 13, the first interlayer insulating film 15, and the second interlayer insulating film 17 as shown in FIG. 3.

The present embodiment discusses an example where the first TFTs 9a, the second TFTs 9b, and the third TFTs 9c all have a top gate structure. Alternatively, the first TFTs 9a, the second TFTs 9b, and the third TFTs 9c may all have a bottom gate structure.

In each subpixel P, the capacitor 9d is electrically connected to an associated one of the first TFTs 9a and an associated one of the power supply lines 20a as shown in FIG. 4. The capacitor 9d includes: a lower conductive layer 14c as the first wiring layer; the first interlayer insulating film 15 covering the lower conductive layer 14c; and the upper conductive layer 16c, as the second wiring layer, on the first interlayer insulating film 15 and overlapping the lower conductive layer 14c, as shown in FIG. 3. The upper conductive layer 16c is electrically connected to the power supply line 20a via a contact hole (not shown) formed through the second interlayer insulating film 17 and the first planarization film 19a.

The first planarization film 19a and the second planarization film 21a have a flat surface in the display area D and are made of, for example, either an organic resin material such as a polyimide resin or an acrylic resin or a polysiloxane-based SOG (spin on glass) material. Here, besides the aforementioned power supply line 20a, there is provided a relay electrode 20b as the fourth wiring layer between the first planarization film 19a and the second planarization film 21a as shown in FIG. 3.

The organic EL element layer 35 includes the plurality of first electrodes 31a, an edge cover 32a, the plurality of organic EL layers 33, and a second electrode 34, all of which are sequentially stacked on the TFT layer 30, as shown in FIG. 3.

The plurality of first electrodes 31a are provided on the second planarization film 21a so as to form a matrix, corresponding to the plurality of subpixels P, as shown in FIG. 3. The first electrode 31a is electrically connected to the drain electrode 18d of the third TFT 9c via a contact hole formed through the first planarization film 19a, the relay electrode 20b, and a contact hole formed through the second planarization film 21a as shown in FIG. 3. The first electrode 31a has a function of injecting holes to the organic EL layer 33. The first electrode 31a is more preferably made of a material that has a large work function to improve the efficiency of hole injection to the organic EL layer 33. The first electrode 31a is made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). The first electrode 31a may alternatively be made of, for example, an alloy such as an astatine-astatine oxide (At—$AtO_2$) alloy. As another alternative, the first electrode 31a may be made of, for example, an electrically conductive oxide such as tin oxide (SnO), zinc oxide (ZnO), indium tin oxide (ITO), or indium zinc oxide (IZO). As a further alternative, the first electrode 31a may include a stack of layers of any of these materials. Examples of compound materials that have a large work function include indium tin oxide (ITO) and indium zinc oxide (IZO). Specifically, the first electrode 31a includes, for example, a sequential stack of an approximately 10-nm thick ITO film, an approximately 100-nm thick silver film, and an approximately 10-nm thick ITO film.

The edge cover 32a is formed like a lattice covering the peripheral end portions of the first electrodes 31a as shown in FIG. 3. The edge cover 32a is made of, for example, either an approximately 2.5-μm thick organic resin material such as a polyimide resin or an acrylic resin or an approximately 2.5-μm thick polysiloxane-based SOG material.

The plurality of organic EL layers 33 are disposed respectively on the first electrodes 31a and provided as light-emitting functional layers so as to form a matrix corresponding to the plurality of subpixels P, as shown in FIG. 3. Each organic EL layer 33 includes a hole injection layer 1, a hole transport layer 2, a light-emitting layer 3, an electron transport layer 4, and an electron injection layer 5, all of which are sequentially disposed on the first electrode 31a as shown in FIG. 5.

The hole injection layer 1 is alternatively referred to as the anode buffer layer and has a function of bringing the energy levels of the first electrode 31a and the organic EL layer 33 closer to each other to improve the efficiency of hole injection from the first electrode 31a to the organic EL layer 33. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styryl anthracene derivative, a fluorenone derivative, a hydrazone derivative, or a stilbene derivative.

The hole transport layer 2 has a function of improving the efficiency of hole transport from the first electrode 31a to the organic EL layer 33. The hole transport layer 2 is made of, for example, a porphyrin derivative, an aromatic tertiary amine compound, a styryl amine derivative, polyvinyl carbazole, poly-p-phenylenevinylene, polysilane, a triazole derivative, an oxadiazole derivative, an imidazole derivative, a polyaryl alkane derivative, a pyrazoline derivative, a pyrazolone derivative, a phenylenediamine derivative, an aryl amine derivative, an amine-substituted chalcone derivative, an oxazole derivative, a styryl anthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is injected with holes and electrons from the first electrode 31a and the second electrode 34 respectively when the light-emitting layer 3 is under the voltage applied by the first electrode 31a and the second electrode 34. These injected holes and electrons recombine in the light-emitting layer 3. The light-emitting layer 3 is made of a material that has a high luminous efficiency. The light-emitting layer 3 is made of, for example, a metal oxinoid compound (8-hydroxy quinoline metal complex), a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzothiazole derivative, an styryl derivative, a styryl amine derivative, a bis(styryl)benzene derivative, a tris(styryl)benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylenevinylene, or polysilane.

The electron transport layer 4 has a function of efficiently moving electrons to the light-emitting layer 3. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 34 and the organic EL layer 33 closer to each other to improve the efficiency of electron injection from the second electrode 34 to the organic EL layer 33. This function can lower the drive voltage of the organic EL element. The electron injection layer 5 is alternatively referred to as the cathode buffer layer. The electron injection layer 5 is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 34 is provided on the plurality of organic EL layers 33 commonly across the plurality of subpixels P, in other words, so as to cover each organic EL layer 33 and the edge cover 32a as shown in FIG. 3. The second electrode 34 has a function of injecting electrons to the organic EL layer 33. The second electrode 34 is more preferably made of a material that has a small work function to improve the efficiency of electron injection to the organic EL layer 33. The second electrode 34 is made of, for example, silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), or lithium fluoride (LiF). The second electrode 34 may alternatively be made of, for example, an alloy such as a magnesium-copper (Mg—Cu) alloy, a magnesium-silver (Mg—Ag) alloy, a sodium-potassium (Na—K) alloy, an astatine-astatine oxide (At—$AtO_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrode 34 may be made of, for example, an electrically conductive oxide such as tin oxide (SnO), zinc oxide (ZnO), indium tin oxide (ITO), or indium zinc oxide (IZO). As a further alternative, the second electrode 34 may include a stack of layers of any of these materials. Examples of materials that have a small work function include magnesium (Mg), lithium (Li), lithium fluoride (LiF), a magnesium-copper (Mg—Cu) alloy, a magnesium-silver (Mg—Ag) alloy, a sodium-potassium (Na—K) alloy, a lithium-aluminum (Li—Al) alloy, a lithium-calcium-aluminum (Li—Ca—Al) alloy, and a lithium fluoride-calcium-aluminum (LiF—Ca—Al) alloy.

The sealing film 40 covers the second electrode 34, includes a sequential stack of a first inorganic sealing film 36, an organic sealing film 37, and a second inorganic sealing film 38 on the second electrode 34 as shown in FIG. 3, and has a function of protecting the organic EL layer 33 in the organic EL element layer 35 from, for example, water and oxygen. The first inorganic sealing film 36 and the second inorganic sealing film 38 include, for example, an inorganic insulating film such as a silicon nitride film, a silicon oxide film, or a silicon oxynitride film. The organic sealing film 37 is made of, for example, an organic resin material such as acrylic resin, epoxy resin, silicone resin, polyurea resin, parylene resin, polyimide resin, or polyamide resin.

The touch panel layer 45 is disposed on the sealing film 40 and includes first touch wiring layers 41a, the third interlayer insulating film 42, second touch wiring layers 43a, and an overcoat film 44a, all of which are sequentially stacked on the second inorganic sealing film 38 in the sealing film 40, as shown in FIG. 3.

The plurality of first touch wiring layers 41a, in the display area D, are provided, for example, extending parallel to each other in the X-direction in FIG. 1 on the second inorganic sealing film 38 as shown in FIG. 3.

The third interlayer insulating film 42 is disposed covering the first touch wiring layers 41a as shown in FIG. 3.

The plurality of second touch wiring layers 43a, in the display area D, are provided, for example, extending parallel to each other in the Y-direction in FIG. 1 on the third interlayer insulating film 42 as shown in FIG. 3.

The overcoat film 44a is disposed covering the second touch wiring layers 43a on the third interlayer insulating film 42 as shown in FIG. 3.

The organic EL display device 50a includes, in the frame area F: a first damming wall Wa provided like a frame outside the trench G around the display area D; and a second damming wall Wb provided like a frame around the first damming wall Wa, as shown in FIG. 1.

The first damming wall Wa includes; a lower resin layer 21b made of the same material, and provided in the same layer, as the second planarization film 21a; and an upper resin layer 32c made of the same material, and provided in the same layer, as the edge cover 32a and disposed on the lower resin layer 21b via a connection wiring 31b, as shown in FIG. 6. The connection wiring 31b is made of the same material, and provided in the same layer, as the first electrode 31a. The first-damming wall Wa is disposed overlapping the peripheral end portion of the organic sealing film 37 in the sealing film 40 and structured so as to restrain the ink that will form the organic sealing film 37 from spreading.

The second damming wall Wb includes: a lower resin layer 21c made of the same material, and provided in the same layer, as the second planarization film 21a; and an upper resin layer 32d made of the same material, and provided in the same layer, as the edge cover 32a and disposed on the lower resin layer 21c via the connection wiring 31b, as shown in FIG. 6.

In addition, the organic EL display device 50a, as shown in FIG. 1, includes, in the frame area F, a first frame line 18h provided like a frame inside the trench G as the third wiring layer in such a manner that both end regions of the opening of the trench G can reach the terminal section T. The first frame line 18h is structured so as to electrically connect to the power supply line 20a in the display area D via a contact hole formed through the first planarization film 19a to be fed with a high-voltage power supply (ELVDD) by the terminal section T.

In addition, as shown in FIG. 1, the organic EL display device 50a includes, in the frame area F, a second frame line 18i provided generally like a letter C outside the trench G as the third wiring layer and having two end regions reaching the terminal section T. The second frame line 18i is structured so as to electrically connect to the second electrode 34 in the display area D via the connection wiring 31b in the trench G to be fed with a low-voltage power supply (ELVSS) by the terminal section T, as shown in FIG. 6.

In addition, the organic EL display device 50a, as shown in FIG. 6, includes, in the frame area F, a plurality of peripheral photo spacers 32b provided insularly so as to project upward from the edge portions of the trench G. Here, the peripheral photo spacers 32b are made of the same material, and provided in the same layer, as the edge cover 32a.

In addition, the organic EL display device 50a has a slit S through the stack of the base coat film 11, the gate insulating film 13, the first interlayer insulating film 15, and the second interlayer insulating film 17 in the bending section B of the frame area F as shown in FIG. 7. The slit S is provided, as shown in FIG. 7, like a groove that runs through the base coat film 11, the gate insulating film 13, the first interlayer insulating film 15, and the second interlayer insulating film 17 and that passes all the way through in the direction in which the bending section B extends so as to expose the surface of the resin substrate layer 10. The slit S is also formed (with a depth of approximately from 0.5 μm to 3.0 μm) in the surface layer of the second resin substrate layer 8 as shown in FIG. 7. The stack of the base coat film 11, the gate insulating film 13, the first interlayer insulating film 15, and the second interlayer insulating film 17 through which the slit S is formed has both edge portions thereof shaped like an eave projecting internally from a sidewall of the surface layer of the second resin substrate layer 8 as shown in FIG. 7. The first planarization film 19a in the display area D is provided so as to fill the slit S and also fill the second resin substrate layer 8 side of the eave-shaped parts of both edge portions of the stack of the base coat film 11, the gate insulating film 13, the first interlayer insulating film 15, and the second interlayer insulating film 17.

The organic EL display device 50a further includes, as shown in FIG. 7: a plurality of routing wires L extending in the bending section B and the two sides thereof parallel to each other in a direction perpendicular to the direction in which the bending section B extends; a first protective layer 44b and a second protective layer 44c covering the two end regions of each routing wire L; and a reinforcing resin layer 46 covering the second protective layer 44c side of the first protective layer 44b and the first protective layer 44b side of the second protective layer 44c. Protection sheets 47 are provided on the surface of the first resin substrate layer 6 side of the organic EL display device 50a, except for in the bending section B, as shown in FIG. 7. The left and right protection sheets 47 are separated by a distance of, for example, approximately 2.0 mm, and an end of the protection sheet 47 and the slit S are separated by a distance of, for example, approximately 200 μm.

The routing wire L includes, as shown in FIG. 7: a display-side wiring section 18nd on that one of the edge portions of the stack of the base coat film 11, the gate insulating film 13, the first interlayer insulating film 15, and the second interlayer insulating film 17 which is on the display area D side of the stack; a terminal-side wiring section 18nt on that other edge portion of the stack of the base coat film 11, the gate insulating film 13, the first interlayer insulating film 15, and the second interlayer insulating film 17 which is on the terminal section T side of the stack; and an intermediate wiring section C electrically connected to the display-side wiring section 18nd and the terminal-side wiring section 18nt respectively via a first contact hole Ha and a second contact hole Hb formed through the first planarization film 19a.

The display-side wiring section 18nd is electrically connected to the wires disposed in the display area D (e.g., the source lines 18f, the first touch wiring layers 41a, the second touch wiring layers 43a, the first frame line 18h, and the second frame line 18i). The terminal-side wiring section 18nt is electrically connected to a terminal of the terminal section T. The display-side wiring section 18nd and the terminal-side wiring section 18nt are made of the same material, and provided in the same layer, as the third wiring layer.

The intermediate wiring section C includes, as shown in FIG. 7: a first intermediate wiring section 41b disposed on the first planarization film 19a and electrically connected to the display-side wiring section 18nd via the first contact hole Ha; a second intermediate wiring section 41c disposed on the first planarization film 19a and electrically connected to the terminal-side wiring section 18nt via the second contact hole Hb; and a third intermediate wiring section 18nc disposed on the resin substrate layer 10 and electrically connected to the first intermediate wiring section 41b and the second intermediate wiring section 41c respectively via a third contact hole Hc and a fourth contact hole Hd formed through the first planarization film 19a.

The first intermediate wiring section 41b and the second intermediate wiring section 41c are made of the same material, and provided in the same layer, as the first touch wiring layer 41a. The third intermediate wiring section 18nc is made of the same material, and provided in the same layer, as the third wiring layer. The present embodiment discusses an example where the first intermediate wiring section 41b and the second intermediate wiring section 41c are made of the same material, and provided in the same layer, as the first touch wiring layers 41a. Alternatively, the first intermediate wiring section 41b and the second intermediate wiring section 41c may be made of the same material, and provided in the same layer, as the second touch wiring layers 43a.

The first protective layer 44b and the second protective layer 44c are made of the same material, and provided in the same layer, as the overcoat film 44a and disposed covering the first intermediate wiring section 41b and the second intermediate wiring section 41c respectively, as shown in FIG. 7. The first protective layer 44b and the second protective layer 44c are separated from each other by a distance of, for example, approximately 2.5 mm.

The reinforcing resin layer 46 is, made of, for example, acrylic resin with a thickness of approximately 100 μm.

In the organic EL display device 50a described above, in each subpixel P, a gate signal is fed to the first TFT 9a via the gate line 14g, turning on the first TFT 9a. A prescribed voltage corresponding to a source signal is hence written via the source line 18f to the gate electrode of the second TFT 9b and the capacitor 9d. A light-emission control signal is fed to the third TFT 9c via the light-emission control line 14e, turning on the third TFT 9c. A current in accordance with the gate voltage of the second TFT 9b is fed from the power supply line 20a to the organic EL layer 33, causing the light-emitting layer 3 in the organic EL layer 33 to emit light, to produce an image display. Note that in the organic EL display device 50a, the gate voltage of the second TFT 9b is retained by the capacitor 9d when the first TFT 9a is turned off. The light-emitting layer 3 in the subpixel P therefore continuously emits light until a gate signal is fed in a next frame. Additionally, the organic EL display device 50a is structured so that when the surface of an overcoat layer 44a in the display area D is touched, a location detection circuit can calculate and detect the touch position on the basis of a change in electrostatic capacity caused by the touch at intersections of the first touch wiring layers 41a and the second touch wiring layers 43a.

A description is given next of a method of manufacturing the organic EL display device 50a in accordance with the present embodiment. The method of manufacturing the organic EL display device 50a in accordance with the present embodiment includes a TFT layer forming step, an organic EL element layer forming step, a sealing film forming step, and a touch panel layer forming step.

TFT Layer Forming Step

First, for example, after coating a glass substrate with a non-photosensitive polyimide resin (having a thickness of approximately 6 μm), this coating film is subjected to pre-baking and post-baking to form the first resin substrate layer 6.

Subsequently, an inorganic insulating film (having a thickness of approximately 500 nm) such as a silicon oxide film is formed by, for example, plasma CVD (chemical vapor deposition) on the surface of the substrate on which the first resin substrate layer 6 has been formed, to form the intra-substrate inorganic insulating film 7.

Furthermore, for example, after coating the surface of the substrate on which the intra-substrate inorganic insulating film 7 has been formed with a non-photosensitive polyimide resin (having a thickness of approximately 6 μm), this coating film is subjected to pre-baking and post-baking to form the second resin substrate layer 8, thereby completing the formation of the resin substrate layer 10.

Thereafter, a silicon oxide film (having a thickness of approximately 500 nm) and a silicon nitride film (having a thickness of approximately 100 nm) are sequentially formed by, for example, plasma CVD on the surface of the substrate on which the resin substrate layer 10 has been formed, to form the base coat film 11.

Subsequently, after forming, for example, an amorphous silicon film (having a thickness of approximately 50 nm) by plasma CVD on the surface of the substrate on which the base coat film 11 has been formed and crystallizing this amorphous silicon film by, for example, laser annealing, thereby forming a polysilicon, semiconductor film, this semiconductor film is patterned to form, for example, the semiconductor layer 12a.

Thereafter, an inorganic insulating film (approximately 100 nm) such as a silicon oxide film is formed by, for example, plasma CVD on the surface of the substrate on which, for example, the semiconductor layer 12a has been formed, to form the gate insulating film 13 covering, for example, the semiconductor layer 12a.

Furthermore, after forming a molybdenum film (having a thickness of approximately 250 nm) by, for example, sputtering on the surface of the substrate on which the gate insulating film 13 has been formed, this molybdenum film is patterned to form the first wiring layer including the gate lines 14g.

Subsequently, for example, the semiconductor layer 12a is doped with impurity ions using the aforementioned first wiring layer as a mask, to form intrinsic regions and conductive regions in, for example, the semiconductor layer 12a.

Thereafter, a silicon nitride film (having a thickness of approximately 100 nm) is formed by, for example, plasma CVD on the surface of the substrate on which, for example, the semiconductor layer 12a has been formed with intrinsic regions and conductive regions, to form the first interlayer insulating film 15.

Subsequently, after forming a molybdenum film (having a thickness of approximately 250 nm) by, for example, sputtering on the surface of the substrate on which the first interlayer insulating film 15 has been formed, this molybdenum film is patterned to form the second wiring layer including the upper conductive layer 16c.

Furthermore, a silicon oxide film (having a thickness of approximately 300 nm) and a silicon nitride film (having a thickness of approximately 200 nm) are sequentially formed by, for example, plasma CVD on the surface of the substrate on which the aforementioned second wiring layer has been formed, to form the second interlayer insulating film 17.

Thereafter, the gate insulating film 13, the first interlayer insulating film 15, and the second interlayer insulating film 17 are patterned to form a contact hole.

Furthermore, in the bending section B, a stack of the base coat film 11, the gate insulating film 13, the first interlayer insulating film 15, and the second interlayer insulating film 17 is removed by dry etching using, for example, gaseous $SF_6$, gaseous $CF_4$, gaseous $O_2$, or gaseous Ar, to form the slit S in the stack of the base coat film 11, the gate insulating film 13, the first interlayer insulating film 15, and the second interlayer insulating film 17. In this removal, the surface layer of the second resin substrate layer 8 that is exposed in the slit S is also removed by dry etching.

Thereafter, after sequentially forming a titanium film (having a thickness of approximately 50 nm), an aluminum film (having a thickness of approximately 600 nm), and a titanium film (having a thickness of approximately 50 nm) by, for example, sputtering on the surface of the substrate on which the slit S has been formed, these metal stack-layer films are patterned to form the third wiring layer including the source lines 18*f.*

Furthermore, after coating the surface of the substrate on which the aforementioned third wiring layer has been formed with a photosensitive polyimide resin (having a thickness of approximately 2.5 μm) by, for example, spin-coating or slit-coating, this coating film is subjected to pre-baking, exposure, development, and post-baking to form, for example, the first planarization film 19*a*.

Thereafter, after sequentially forming a titanium film (having a thickness of approximately 50 nm), an aluminum film (having a thickness of approximately 600 nm), and a titanium film (having a thickness of approximately 50 nm) by, for example, sputtering on the surface of the substrate on which, for example, the first planarization film 19*a* has been formed, these metal stack-layer films are patterned to form the fourth wiring layer including the power supply lines 20*a*.

Finally, after coating the surface of the substrate on which the aforementioned fourth wiring layer has been formed with a polyimide-based photosensitive resin film (having a thickness of approximately 2.5 μm) by, for example, spin-coating or slit-coating, this coating film is subjected to pre-baking, exposure, development, and post-baking to form, for example, the second planarization film 21*a*.

The TFT layer 30 can be fabricated as described in the foregoing.

Organic EL Element Layer Forming Step (Light-Emitting Element Layer Forming Step)

The first electrodes 31*a*, the edge cover 32*a*, the organic EL layer 33 (the hole injection layer 1, the hole transport layer 2, the light-emitting layer 3, the electron transport layer 4, and the electron injection layer 5), and the second electrode 34 are formed by a well-known method on the second planarization film 21*a* in the TFT layer 30 formed in the aforementioned TFT layer forming step, to form the organic EL element layer 35.

Sealing Film Forming Step

First, on the surface of the substrate on which the organic EL element layer 35 has been formed in the aforementioned organic EL element layer forming step, an inorganic insulating film such as a silicon nitride film, a silicon oxide film, or a silicon oxynitride film is formed by plasma CVD using a mask, to form the first inorganic sealing film 36.

Subsequently, a film of an organic resin material such as an acrylic resin is formed by, for example, inkjet technology on the surface of the substrate on which the first inorganic sealing film 36 has been formed, to form the organic sealing film 37.

Thereafter, an inorganic insulating film such as a silicon nitride film, a silicon oxide film, or a silicon oxynitride film is formed by plasma CVD using a mask on the surface of the substrate on which the organic sealing film 37 has been formed, to form the second inorganic sealing film 38, thereby completing the formation of the sealing film 40.

Touch Panel Layer Forming Step

First, after sequentially forming a titanium film (having a thickness of approximately 50 nm), an aluminum film (having a thickness of approximately 300 nm), and a titanium film (having a thickness of approximately 50 nm) by, For instance, sputtering on the surface of the substrate on which the sealing film 40 has been formed in the sealing film forming step, these metal stack-layer films are patterned to form, for example, the first touch wiring layers 41*a*.

Subsequently, a silicon nitride film (approximately 400 nm) is formed by, for example, plasma CVD on the surface of the substrate on which, for example, the first touch wiring layers 41*a* have been formed, to form the third interlayer insulating film 42.

Furthermore, after sequentially forming a titanium film (having a thickness of approximately 50 nm), an aluminum film (having a thickness of approximately 300 nm), and a titanium film (having a thickness of approximately 50 nm) by, for example, sputtering on the surface of the substrate on which the third interlayer insulating film 42 has been formed, these metal stack-layer films are patterned to form, for example, the second touch wiring layers 43*a*.

Thereafter, after coating the surface of the substrate on which, for example, the second touch wiring layers 43*a* have been formed with a photosensitive transparent acrylic resin (having a thickness of approximately 2.0 m) by, for example, spin-coating or slit-coating, this coating film is subjected to pre-baking, exposure, development, and post-baking to form, for example, the overcoat film 44*a*, thereby completing the formation of the touch panel layer 45.

Subsequently, after attaching a front-face-side protection sheet (not shown) to the surface of the substrate on which the touch panel layer 45 has been formed, a laser beam is shone onto the glass substrate side of the resin substrate layer 10, to detach the glass substrate from the bottom face of the resin substrate layer 10. Then, the bottom-face-side protection sheet 47 are attached to the bottom face of the resin substrate layer 10 from which the glass substrate has been detached.

Furthermore, after removing parts of the front-face-side protection sheet that overlap the bending section B and the terminal section T and parts of the bottom-face-side protection sheet 47 that overlap the bending section B, the front face side of the bending section B is coated with an ultraviolet-curing acrylic resin up to a thickness of approximately 100 μm, and this acrylic resin is cured, to form the reinforcing resin layer 46.

The organic EL display device 50*a* in accordance with the present embodiment can be manufactured as described in the foregoing.

As described above, in the organic EL display device 50*a* in accordance with the present embodiment, the slit S is provided in the bending section B through the stack, which is a part of the TFT layer 30, of the base coat film 11, the gate insulating film 13, the first interlayer insulating film 15, and the second interlayer insulating film 17, extending in the direction in which the bending section B extends to expose the surface of the resin substrate layer 10. The first planarization film 19*a*, which is also a part of the TFT layer 30, is provided in the bending section B, filling the slit S. Since the first planarization film 19*a* is provided not only in the bending section B, but also in the display area D, the interior of the slit S can be filled at low cost. In addition, the plurality of routing wires L are provided in the bending section B and the two sides thereof in such a manner as to extend parallel to each other in a direction perpendicular to the direction in which the bending section B extends. Each routing wire L includes: the display-side wiring section 18*nd* on that one of the edge portions of the stack of the base coat film 11, the gate insulating film 13, the first interlayer insulating film 15, and the second interlayer insulating film 17 which is on the display area D side of the stack; the terminal-side wiring section 18*nt* on that other edge portion of the stack of the base coat film 11, the gate insulating film 13, the first interlayer insulating film 15, and the second interlayer insulating film 17 which is on the terminal section T side of the stack; and the intermediate wiring section C electrically connected to the display-side wiring section 18nd and the terminal-side wiring section 18nt respectively via the first contact hole Ha and the second contact hole Hb formed through the first planarization film 19a. Furthermore, the intermediate wiring section C includes: the first intermediate wiring section 41b disposed on the first planarization film 19a and electrically connected to the display-side wiring section 18nd via the first contact hole Ha; the second intermediate wiring section 41c disposed on the first planarization film 19a and electrically connected to the terminal-side wiring section 18nt via the second contact hole Hb; and the third intermediate wiring section 18nc disposed on the resin substrate layer 10 and electrically connected to the first intermediate wiring section 41b and the second intermediate wiring section 41c respectively via the third contact hole He and the fourth contact hole Hd formed through the first planarization film 19a. Therefore, each routing wire L is provided circumventing the two edge portions of the stack of the base coat film 11, the gate insulating film 13, the first interlayer insulating film 15, and the second interlayer insulating film 17 through which the slit S is formed. This structure can restrain the routing wires L from breaking near the bending section B due to the two edge portions of the stack of the base coat film 11, the gate insulating film 13, the first interlayer insulating film 15, and the second interlayer insulating film 17 through which the slit S is formed.

In addition, in the organic EL display device 50a in accordance with the present embodiment, the slit S, which is formed through the stack of the base coat film 11, the gate insulating film 13, the first interlayer insulating film 15, and the second interlayer insulating film 17, is provided also in the surface layer of the second resin substrate layer 8. This structure facilitates bending of the organic EL display device 50a in the bending section B.

Second Embodiment

Figure 8:
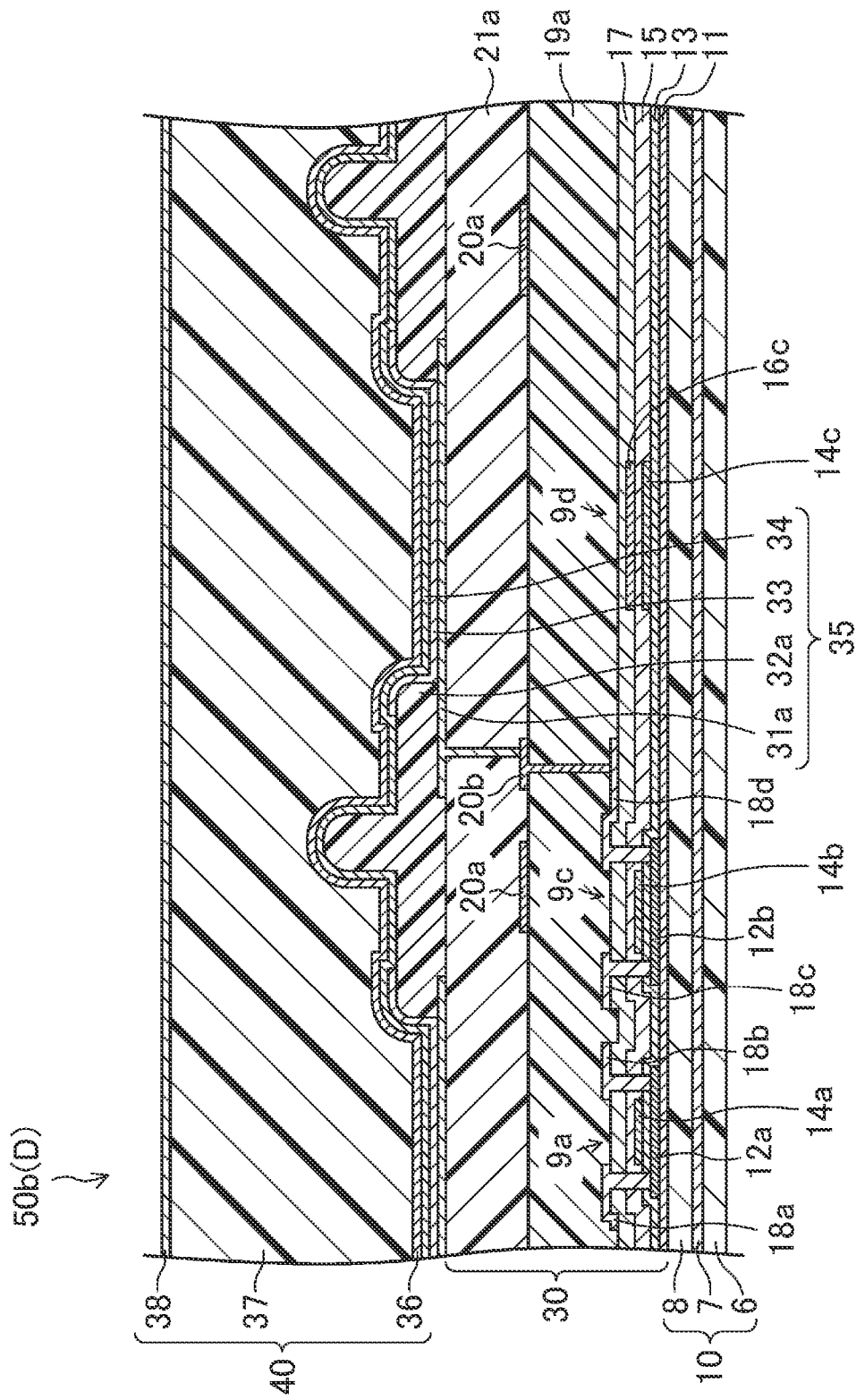
FIG. 8 is a cross-sectional view, corresponding to FIG. 3, of a display area of an organic EL display device in accordance with a second embodiment of the disclosure.
Figure 9:
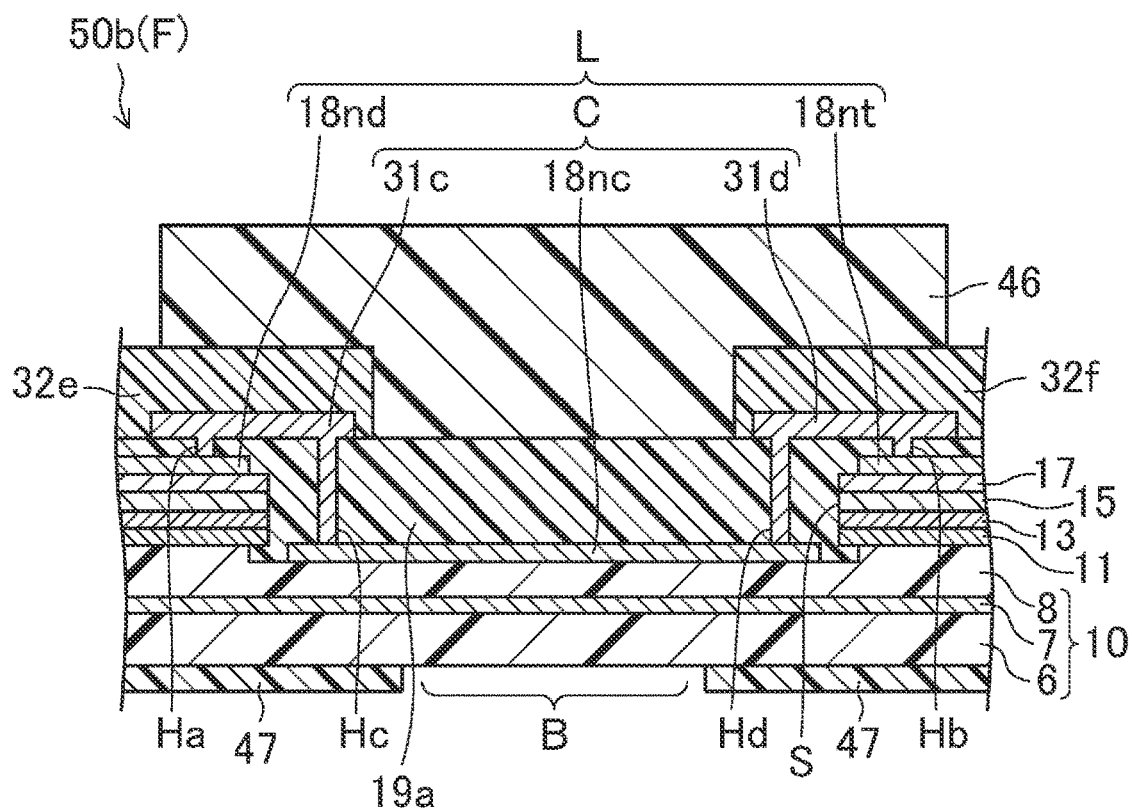
FIG. 9 is a cross-sectional view, corresponding to FIG. 7, of a frame area of the organic EL display device in accordance with the second embodiment of the disclosure.

FIGS. 8 and 9 represent a second embodiment of the display device in accordance with the disclosure. FIG. 8 is a cross-sectional view, corresponding to FIG. 3, of a display area D of an organic EL display device 50b in accordance with the present embodiment. FIG. 9 is a cross-sectional view, corresponding to FIG. 7, of a frame area F of the organic EL display device 50b. Members of this and subsequent embodiments that are the same as those shown in FIGS. 1 to 7 are indicated by the same reference signs or numerals, and detailed description thereof is omitted.

The first embodiment has discussed an example where the organic EL display device 50a includes the touch panel layer 45. The present embodiment discusses the organic EL display device 50b including no touch panel layer (45) as an example.

Similarly to the organic EL display device 50a in accordance with the first embodiment described above, the organic EL display device 50b includes the display area D and the frame area F surrounding the display area D.

The organic EL display device 50b includes: a resin substrate layer 10; a TFT layer 30 on the resin substrate layer 10; an organic EL element layer 35 on the TFT layer 30; and a sealing film 40 on the organic EL element layer 35, as shown in FIG. 8.

Similarly to the organic EL display device 50a in accordance with the first embodiment described above, the organic EL display device 50b includes, in the frame area F:

a first damming wall Wa provided like a frame outside a trench G around the display area D; and a second damming wall Wb provided like a frame around the first damming wall Wa.

Similarly to the organic EL display device 50a in accordance with the first embodiment described above, the organic EL display device 50b includes, in the frame area F, a first frame line 18h provided like a frame inside the trench G as the third wiring layer in such a manner that both end regions of the opening of the trench G can reach the terminal section T.

Similarly to the organic EL display device 50a in accordance with the first embodiment described above, the organic EL display device 50b includes, in the frame area F, a second frame line 18i provided generally like a letter C outside the trench G as the third wiring layer and having two end regions reaching the terminal section T.

Similarly to the organic EL display device 50a in accordance with the first embodiment described above, the organic EL display device 50b includes, in the frame area F, a plurality of peripheral photo spacers 32b provided insularly so as to project upward from the edge portions of the trench G.

Similarly to the organic EL display device 50a in accordance with the first embodiment described above, the organic EL display device 50b has a slit S through a stack of the base coat film 11, the gate insulating film 13, the first interlayer insulating film 15, and the second interlayer insulating film 17 in a bending section B of the frame area F as shown in FIG. 9.

The organic EL display device 50b includes, as shown in FIG. 9: a plurality of routing wires L extending in the bending section B and the two sides thereof parallel to each other in a direction perpendicular to the direction in which the bending section extends; a first protective layer 32e and a second protective layer 32f covering the two end regions of each routing wire L; and a reinforcing resin layer 46 covering the second protective layer 32f side of the first protective layer 32e and the first protective layer 32e side of the second protective layer 32f.

The routing wire L includes, as shown in FIG. 9: a display-side wiring section 18nd on that one of the edge portions of the stack of the base coat film 11, the gate insulating film 13, the first interlayer insulating film 15, and the second interlayer insulating film 17 which is on the display area D side of the stack; a terminal-side wiring section 18nt on that other edge portion of the stack of the base coat film 11, the gate insulating film 13, the first interlayer insulating film 15, and the second interlayer insulating film 17 which is on the terminal section T side of the stack; and an intermediate wiring section C electrically connected to the display-side wiring section 18nd and the terminal-side wiring section 18nt respectively via a first contact hole Ha and a second contact hole Hb formed through a first planarization film 19a.

The intermediate wiring section C includes, as shown in FIG. 9: a first intermediate wiring section 31c disposed on the first planarization film 19a and electrically connected to the display-side wiring section 18nd via the first contact hole Ha; a second intermediate wiring section 31d disposed on the first planarization film 19a and electrically connected to the terminal-side wiring section 18nt via the second contact hole Hb; and a third intermediate wiring section 18nc disposed on the resin substrate layer 10 and electrically connected to the first intermediate wiring section 31c and the second intermediate wiring section 31d respectively via a third contact hole Hc and a fourth contact hole Hd formed through the first planarization film 19a.

The first intermediate wiring section 31c and the second intermediate wiring section 31d are made of the same material, and provided in the same layer, as the first electrodes 31a.

The first protective layer 32e and the second protective layer 32f are made of the same material, and provided in the same layer, as the edge cover 32a, respectively covering the first intermediate wiring section 31c and the second intermediate wiring section 31d as shown in FIG. 9.

Similarly to the organic EL display device 50a in accordance with the first embodiment described above, the organic EL display device 50b described here is flexible and structured, in each subpixel P, so as to cause the light-emitting layer 3 in the organic EL layer 33 to emit light in a suitable manner via the first TFT 9a, the second TFT 9b, and the third TFT 9c, to produce an image display. Additionally, the organic EL display device 50b is structured so that when the surface of the overcoat layer 44a in the display area D is touched, a location detection circuit can calculate and detect the touch position on the basis of a change in electrostatic capacity caused by the touch at intersections of the first touch wiring layers 41a and the second touch wiring layers 43a.

The organic EL display device 50b in accordance with the present embodiment can be manufactured by forming the first intermediate wiring section 31c and the second intermediate wiring section 31d when the first electrodes 31a are formed, forming the first protective layer 32e and the second protective layer 32f when the edge cover 32a is formed, and skipping the step of forming the touch panel layer 45 in the touch panel layer forming step, in the method of manufacturing the organic EL display device 50a in accordance with the first embodiment described above.

As described above, in the organic EL display device 50b in accordance with the present embodiment, the slit S is provided in the bending section B through the stack, which is a part of the TFT layer 30, of the base coat film 11, the gate insulating film 13, the first interlayer insulating film 15, and the second interlayer insulating film 17, extending in the direction in which the bending section B extends to expose the surface of the resin substrate layer 10. The first planarization film 19a, which is also a part of the TFT layer 30, is provided in the bending section B, filling the slit S. Since the first planarization film 19a is provided not only in the bending section B, but also in the display area D, the interior of the slit S can be filled at low cost. In addition, the plurality of routing wires L are provided in the bending section B and the two sides thereof in such a manner as to extend parallel to each other in a direction perpendicular to the direction in which the bending section B extends. Each routing wire L includes: the display-side wiring section 18nd on that one of the edge portions of the stack of the base coat film 11, the gate insulating film 13, the first interlayer insulating film 15, and the second interlayer insulating film 17 which is on the display area D side of the stack; the terminal-side wiring section 18nt on that other edge portion of the stack of the base coat film 11, the gate insulating film 13, the first interlayer insulating film 15, and the second interlayer insulating film 17 which is on the terminal section T side of the stack; and the intermediate wiring section C electrically connected to the display-side wiring section 18nd and the terminal-side wiring section 18nt respectively via the first contact hole Ha and the second contact hole Hb formed through the first planarization film 19a. Furthermore, the intermediate wiring section C includes: the first intermediate wiring section 31c disposed on the first planarization film 19a and electrically connected to the display-side wiring section 18nd via the first contact hole Ha; the second intermediate wiring section 31d disposed on the first planarization film 19a and electrically connected to the terminal-side wiring section 18nt via the second contact hole Hb; and the third intermediate wiring section 18nc disposed on the resin substrate layer 10 and electrically connected to the first intermediate wiring section 31c and the second intermediate wiring section 31d respectively via the third contact hole Hc and the fourth contact hole Hd formed through the first planarization film 19a. Therefore, each routing wire L is provided circumventing the two edge portions of the stack of the base coat film 11, the gate insulating film 13, the first interlayer insulating film 15, and the second interlayer insulating film 17 through which the slit S is formed. This structure can restrain the routing wires L from breaking near the bending section B due to the two edge portions of the stack of the base coat film 11, the gate insulating film 13, the first interlayer insulating film 15, and the second interlayer insulating film 17 through which the slit S is formed.

In addition, in the organic EL display device 50b in accordance with the present embodiment, the slit S, which is formed through the stack of the base coat film 11, the gate insulating film 13, the first interlayer insulating film 15, and the second interlayer insulating film 17, is provided also in the surface layer of the second resin substrate layer 8. This structure facilitates bending of the organic EL display device 50b in the bending section B.

Third Embodiment

Figure 10:
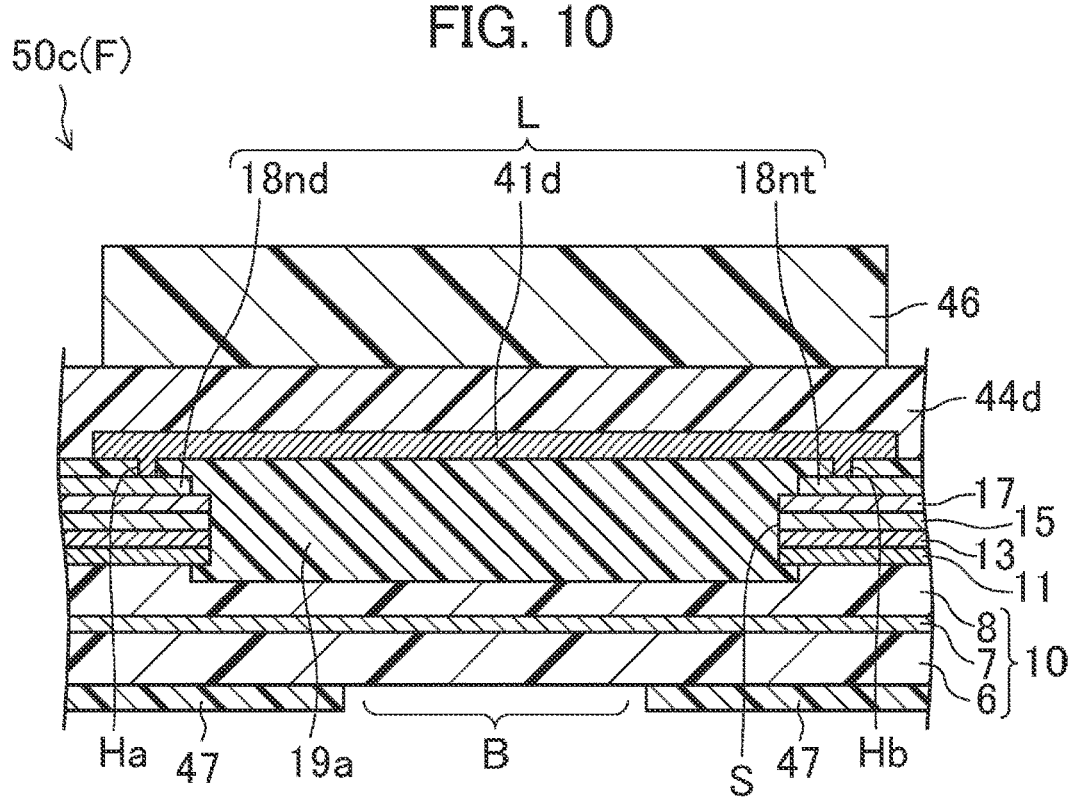
FIG. 10 is a cross-sectional view, corresponding to FIG. 7, of a frame area of an organic EL display device in accordance with a third embodiment of the disclosure.

FIG. 10 represents a third embodiment of the display device in accordance with the disclosure. FIG. 10 is a cross-sectional view, corresponding to FIG. 7, of a frame area F of an organic EL display device 50c in accordance with the present embodiment.

The first embodiment discussed an example where the organic EL display device 50a includes the intermediate wiring section C including the first intermediate wiring section 41b, the second intermediate wiring section 41c, and the third intermediate wiring section 18nc. The present embodiment discusses an example where the organic EL display device 50c includes an integrated intermediate wiring section 41d.

Similarly to the organic EL display device 50a in accordance with the first embodiment described above, the organic EL display device 50c includes a display area D and the frame area F surrounding the display area D.

Similarly to the organic EL display device 50a in accordance with the first embodiment described above, the organic EL display device 50c includes: a resin substrate layer 10; a TFT layer 30 on the resin substrate layer 10; an organic EL element layer 35 on the TFT layer 30; a sealing film 40 on the organic EL element layer 35; and a touch panel layer 45 on the sealing film 40.

Similarly to the organic EL display device 50a in accordance with the first embodiment described above, the organic EL display device 50c includes, in the frame area F: a first damming wall Wa provided like a frame outside the trench G around the display area D; and a second damming wall Wb provided like a frame around the first damming wall Wa.

Similarly to the organic EL display device 50a in accordance with the first embodiment described above, the organic EL display device 50c includes, in the frame area F, a first frame line 18h provided like a frame inside the trench G as the third wiring layer in such a manner that both end regions of the opening of the trench G can reach the terminal section T.

Similarly to the organic EL display device 50a in accordance with the first embodiment described above, the organic EL display device 50c includes, in the frame area F, a second frame line 18i provided generally like a letter C outside the trench G as the third wiring layer and having two end regions reaching the terminal section T.

Similarly to the organic EL display device 50a in accordance with the first embodiment described above, the organic EL display device 50c includes, in the frame area F, a plurality of peripheral photo spacers 32b provided insularly so as to project upward from the edge portions of the trench G.

Similarly to the organic EL display device 50a in accordance with the first embodiment described above, the organic EL display device 50c has a slit S through a stack of the base coat film 11, the gate insulating film 13, the first interlayer insulating film 15, and the second interlayer insulating film 17 in a bending section B of the frame area F as shown in FIG. 10.

The organic EL display device 50c includes, as shown in FIG. 10: a plurality of routing wires L extending in the bending section B and the two sides thereof parallel to each other in a direction perpendicular to the direction in which the bending section extends; a protective layer 44d covering the intermediate wiring section 41d (detailed later) of each routing wire L; and a reinforcing resin layer 46 on the protective layer 44d.

The routing wire L includes, as shown in FIG. 10: a display-side wiring section 18nd on that one of the edge portions of the stack of the base coat film 11, the gate insulating film 13, the first interlayer insulating film 15, and the second interlayer insulating film 17 which is on the display area D side of the stack; a terminal-side wiring section 18nt on that other edge portion of the stack of the base coat film 11, the gate insulating film 13, the first interlayer insulating film 15, and the second interlayer insulating film 17 which is on the terminal section T side of the stack; and an intermediate wiring section 41d electrically connected to the display-side wiring section 18nd and the terminal-side wiring section 18nt respectively via a first contact hole Ha and a second contact hole Hb formed through the first planarization film 19a.

The intermediate wiring section 41d is made of the same material, and provided in the same layer, as the first touch wiring layers 41a. The present embodiment has discussed an example where the intermediate wiring section 41d is made of the same material, and provided in the same layer, as the first touch wiring layers 41a. Alternatively, the intermediate wiring section 41d may be made of the same material, and provided in the same layer, as the second touch wiring layers 43a.

The protective layer 44d is made of the same material, and provided in the same layer, as the overcoat film 44a.

Similarly to the organic EL display device 50a in accordance with the first embodiment described above, the organic EL display device 50c described here is flexible and structured, in each subpixel P, so as to cause the light-emitting layer 3 in the organic EL layer 33 to emit light in a suitable manner via the first TFT 9a, the second TFT 9b, and the third TFT 9c, to produce an image display. Additionally, the organic EL display device 50c is structured so that when the surface of the overcoat layer 44a in the display area D is touched, a location detection circuit can calculate and detect the touch position on the basis of a change in electrostatic capacity caused by the touch at intersections of the first touch wiring layers 41a and the second touch wiring layers 43a.

The organic EL display device 50c in accordance with the present embodiment can be manufactured by changing the pattern shape of the third wiring layer and forming the intermediate wiring section 41d instead of the first intermediate wiring section 41b and the second intermediate wiring section 41c when the first touch wiring layers 41a are formed, in the method of manufacturing the organic EL display device 50a in accordance with the first embodiment described above.

As described above, in the organic EL display device 50c in accordance with the present embodiment, the slit S is provided in the bending section B through the stack, which is a part of the TFT layer 30, of the base coat film 11, the gate insulating film 13, the first interlayer insulating film 15, and the second interlayer insulating film 17, extending in the direction in which the bending section B extends to expose the surface of the resin substrate layer 10. The first planarization film 19a, which is also a part of the TFT layer 30, is provided in the bending section B, filling the slit S. Since the first planarization film 19a is provided not only in the bending section B, but also in the display area D, the interior of the slit S can be filled at low cost. In addition, the plurality of routing wires L are provided in the bending section B and the two sides thereof in such a manner as to extend parallel to each other in a direction perpendicular to the direction in which the bending section B extends. Each routing wire L includes: the display-side wiring section 18nd on that one of the edge portions of the stack of the base coat film 11, the gate insulating film 13, the first interlayer insulating film 15, and the second interlayer insulating film 17 which is on the display area D side of the stack; the terminal-side wiring section 18nt on that other edge portion of the stack of the base coat film 11, the gate insulating film 13, the first interlayer insulating film 15, and the second interlayer insulating film 17 which is on the terminal section T side of the stack; and the intermediate wiring section 41d electrically connected to the display-side wiring section 18nd and the terminal-side wiring section 18nt respectively via the first contact hole Ha and the second contact hole Hb formed through the first planarization film 19a. Therefore, each routing wire L is provided circumventing the two edge portions of the stack of the base coat film 11, the gate insulating film 13, the first interlayer insulating film 15, and the second interlayer insulating film 17 through which the slit S is formed. This structure can restrain the routing wires L from breaking near the bending section B due to the two edge portions of the stack the base coat film 11, the gate insulating film 13, the first interlayer insulating film 15, and the second interlayer insulating film 17 through which the slit S is formed.

In addition, in the organic EL display device 50c in accordance with the present embodiment, the slit S, which is formed through the stack of the base coat film 11, the gate insulating film 13, the first interlayer insulating film 15, and the second interlayer insulating film 17, is provided also in the surface layer of the second resin substrate layer 8. This structure facilitates bending of the organic EL display device 50c in the bending section B.

Other Embodiments

The foregoing embodiments have discussed examples where each routing wire in the organic EL display device includes a display-side wiring section, a terminal-side wiring section, and an intermediate wiring section. The disclosure however requires only that at least one of the plurality of routing wires includes a display-side wiring section, a terminal-side wiring section, and an intermediate wiring section.

The foregoing embodiments have discussed, as an example, a structure where the display-side wiring section and the terminal-side wiring section of each routing wire are made of the same material, and provided in the same layer, as the third wiring layer. Alternatively, the display-side wiring section and the terminal-side wiring section may be made of the same material, and provided in the same layer, as the fourth wiring layer.

The foregoing embodiments have discussed examples where the organic EL layer has a 5-layer stack structure that includes a hole injection layer, a hole transport layer, a light-emitting layer, an electron transport layer, and an electron injection layer. Alternatively, the organic EL layer may have, for example, a 3-layer stack structure that includes a hole injection and transport layer, a light-emitting layer, and an electron transport and injection layer.

Additionally, the foregoing embodiments have discussed examples where the organic EL display device includes a first electrode as an anode and a second electrode as a cathode. The disclosure is equally applicable to organic EL display devices in which the layered structure of the organic EL layer is reversed, to include a first electrode as a cathode and a second electrode as an anode.

In addition, the foregoing embodiments have discussed examples where the organic EL display device including TFTs with a drain electrode connected to the first electrode. The disclosure is equally applicable to organic EL display devices including TFTs with a source electrode connected to the first electrode.

In addition, the foregoing embodiments have discussed organic EL display devices as an example of the display device. The disclosure is equally applicable to display devices including a plurality of current-driven light-emitting elements, for example, applicable to display devices including QLEDs (quantum-dot light-emitting diodes) which are light-emitting elements using a quantum-dot layer.

INDUSTRIAL APPLICABILITY

As described above, the disclosure is useful in flexible display devices.

The invention claimed is:
1. A display device comprising:
a resin substrate layer;
a thin film transistor layer on the resin substrate layer, the thin film transistor layer including a sequential stack of an inorganic insulating film, a wiring layer, and a planarization film;
a light-emitting element layer on the thin film transistor layer, the light-emitting element layer including a sequential stack of a plurality of first electrodes, a plurality of light-emitting functional layers, and a common second electrode that are arranged in such a manner as to correspond to a plurality of subpixels in a display area;
a sealing film covering the light-emitting element layer and including a sequential stack of a first inorganic sealing film, an organic sealing film, and a second inorganic sealing film; and
a touch panel layer on the sealing film, the touch panel layer including a sequential stack of a first touch wiring layer, an interlayer insulating film, a second touch wiring layer, and an overcoat film, wherein:
a frame area is provided around the display area,
a terminal section is provided on an end region of the frame area,
a bending section is provided extending in one direction between the display area and the terminal section,
the inorganic insulating film has a slit, extending through the inorganic insulating film in the bending section and in a direction in which the bending section extends, to expose a surface of the resin substrate layer,
the planarization film is provided in the bending section to fill the slit,
a plurality of routing wires is provided extending, in the bending section and two sides of the bending section, parallel to each other in a direction that intersects with the direction in which the bending section extends,
at least one of the plurality of routing wires includes:
a display-side wiring section on an edge portion of the inorganic insulating film that is on a display area side of the inorganic insulating film, the display-side wiring section being made of a same material, and provided in a same layer, as the wiring layer,
a terminal-side wiring section on another edge portion of the inorganic insulating film that is on a terminal section side of the inorganic insulating film, the terminal-side wiring section being made of the same material, and provided in the same layer, as the wiring layer, and
an intermediate wiring section electrically connected to the display-side wiring section and the terminal-side wiring section, respectively, via a first contact hole and a second contact hole, both formed through the planarization film, and
the intermediate wiring section includes:
a first intermediate wiring section on the planarization film, the first intermediate wiring section being made of a same material, and provided in a same layer, as the first touch wiring layer or the second touch wiring layer, and electrically connected to the display-side wiring section via the first contact hole,
a second intermediate wiring section on the planarization film, the second intermediate wiring section being made of the same material, and provided in the same layer, as the first touch wiring layer or the second touch wiring layer, and electrically connected to the terminal-side wiring section via the second contact hole, and
a third intermediate wiring section on the resin substrate layer, the third intermediate wiring section being made of the same material, and provided in the same layer, as the wiring layer, and electrically connected to the first intermediate wiring section and the second intermediate wiring section, respectively, via a third contact hole and a fourth contact hole, both formed through the planarization film.

2. The display device according to claim 1, wherein the first intermediate wiring section and the second intermediate wiring section are, respectively, covered by a first protective layer and a second protective layer, both made of a same material, and provided in a same layer, as the overcoat film.

3. The display device according to claim 2, wherein a second protective layer side of the first protective layer and a first protective layer side of the second protective layer are covered by a reinforcing resin layer provided on the planarization film.

4. The display device according to claim 1, wherein the resin substrate layer includes:
a first resin substrate layer;
a second resin substrate layer on a thin film transistor layer side; and
an intra-substrate inorganic insulating film between the first resin substrate layer and the second resin substrate layer.

5. The display device according to claim 4, wherein the slit is provided also in a surface layer of the second resin substrate layer.

6. The display device according to claim 5, wherein a plurality of edge portions, including the edge portion and the other edge portion, of the inorganic insulating film through which the slit is formed has an eave shape, such that the plurality of edge portions projects internally to a sidewall of the surface layer of the second resin substrate layer.

7. The display device according to claim 6, wherein the planarization film is provided, such that to fill a second resin substrate layer side of the eave on the edge portions of the inorganic insulating film.

8. A display device comprising:
a resin substrate layer;
a thin film transistor layer on the resin substrate layer, the thin film transistor layer including a sequential stack of an inorganic insulating film, a wiring layer, and a planarization film; and
a light-emitting element layer on the thin film transistor layer, the light-emitting element layer including a sequential stack of a plurality of first electrodes, a plurality of light-emitting functional layers, and a common second electrode that are arranged in such a manner as to correspond to a plurality of subpixels in a display area, wherein:
a frame area is provided around the display area,
a terminal section is provided on an end region of the frame area,
a bending section is provided extending in one direction between the display area and the terminal section,
the inorganic insulating film has a slit, extending through the inorganic insulating film in the bending section and in a direction in which the bending section extends, to expose a surface of the resin substrate layer,
the planarization film is provided in the bending section to fill the slit,
a plurality of routing wires is provided extending, in the bending section and two sides of the bending section, parallel to each other in a direction that intersects with the direction in which the bending section extends,
at least one of the plurality of routing wires includes:
a display-side wiring section on an edge portion of the inorganic insulating film that is on a display area side of the inorganic insulating film, the display-side wiring section being made of a same material, and provided in a same layer, as the wiring layer,
a terminal-side wiring section on another edge portion of the inorganic insulating film that is on a terminal section side of the inorganic insulating film, the terminal-side wiring section being made of the same material, and provided in the same layer, as the wiring layer, and
an intermediate wiring section electrically connected to the display-side wiring section and the terminal-side wiring section, respectively, via a first contact hole and a second contact hole, both formed through the planarization film, and
the intermediate wiring section includes:
a first intermediate wiring section on the planarization film, the first intermediate wiring section being made of a same material, and provided in a same layer, as the plurality of first electrodes, and electrically connected to the display-side wiring section via the first contact hole,
a second intermediate wiring section on the planarization film, the second intermediate wiring section being made of the same material, and provided in the same layer, as the plurality of first electrodes, and electrically connected to the terminal-side wiring section via the second contact hole, and
a third intermediate wiring section on the resin substrate layer, the third intermediate wiring section being made of the same material, and provided in the same layer, as the wiring layer, and electrically connected to the first intermediate wiring section and the second intermediate wiring section, respectively, via a third contact hole and a fourth contact hole, both formed through the planarization film.

9. The display device according to claim 8, wherein
the light-emitting element layer further includes an edge cover provided commonly to the plurality of subpixels between the plurality of first electrodes and the plurality of light-emitting functional layers, the edge cover covering a peripheral end portion of each of the plurality of first electrodes, and
the first intermediate wiring section and the second intermediate wiring section are, respectively, covered by a first protective layer and a second protective layer, both made of a same material, and provided in a same layer, as the edge cover.

10. The display device according to claim 9, wherein a second protective layer side of the first protective layer and a first protective layer side of the second protective layer are covered by a reinforcing resin layer provided on the planarization film.

11. The display device according to claim 8, wherein the resin substrate layer includes:
a first resin substrate layer;
a second resin substrate layer on a thin film transistor layer side; and
an intra-substrate inorganic insulating film between the first resin substrate layer and the second resin substrate layer.

12. The display device according to claim 11, wherein the slit is provided also in a surface layer of the second resin substrate layer.

13. The display device according to claim 12, wherein a plurality of edge portions, including the edge portion and the other edge portion, of the inorganic insulating film through which the slit is formed has an eave shape, such that the plurality of edge portions projects internally to a sidewall of the surface layer of the second resin substrate layer.

14. The display device according to claim 13, wherein the planarization film is provided, such that to fill a second resin substrate layer side of the eave on the edge portions of the inorganic insulating film.

15. A display device comprising:
a resin substrate layer;
a thin film transistor layer on the resin substrate layer, the thin film transistor layer including a sequential stack of an inorganic insulating film, a wiring layer, and a planarization film;
a light-emitting element layer on the thin film transistor layer, the light-emitting element layer including a sequential stack of a plurality of first electrodes, a plurality of light-emitting functional layers, and a common second electrode that are arranged in such a manner as to correspond to a plurality of subpixels in a display area;

a sealing film covering the light-emitting element layer and including a sequential stack of a first inorganic sealing film, an organic sealing film, and a second inorganic sealing film; and a touch panel layer on the sealing film, the touch panel layer including a sequential stack of a first touch wiring layer, an interlayer insulating film, a second touch wiring layer, and an overcoat film, wherein:

a frame area is provided around the display area, a terminal section is provided on an end region of the frame area, a bending section is provided extending in one direction between the display area and the terminal section, the inorganic insulating film has a slit, extending through the inorganic insulating film in the bending section and in a direction in which the bending section extends, to expose a surface of the resin substrate layer, the planarization film is provided in the bending section to fill the slit, a plurality of routing wires is provided extending, in the bending section and two sides of the bending section, parallel to each other in a direction that intersects with the direction in which the bending section extends, at least one of the plurality of routing wires includes:
a display-side wiring section on an edge portion of the inorganic insulating film that is on a display area side of the inorganic insulating film, the display-side wiring section being made of a same material, and provided in a same layer, as the wiring layer, a terminal-side wiring section on another edge portion of the inorganic insulating film that is on a terminal section side of the inorganic insulating film, the terminal-side wiring section being made of the same material, and provided in the same layer, as the wiring layer, and an intermediate wiring section electrically connected to the display-side wiring section and the terminal-side wiring section, respectively, via a first contact hole and a second contact hole, both formed through the planarization film, and the intermediate wiring section is provided on the planarization film and made of a same material, and provided in a same layer, as the first touch wiring layer or the second touch wiring layer.

16. The display device according to claim 15, wherein the intermediate wiring section is covered by a protective layer made of a same material, and provided in a same layer, as the overcoat film.

17. The display device according to claim 16, further comprising a reinforcing resin layer on the protective layer.

18. The display device according to claim 15, wherein the resin substrate layer includes:
a first resin substrate layer;
a second resin substrate layer on a thin film transistor layer side; and
an intra-substrate inorganic insulating film between the first resin substrate layer and the second resin substrate layer.

19. The display device according to claim 18, wherein the slit is provided also in a surface layer of the second resin substrate layer.

20. The display device according to claim 19, wherein a plurality of edge portions, including the edge portion and the other edge portion, of the inorganic insulating film through which the slit is formed has an eave shape, such that the plurality of edge portions projects internally to a sidewall of the surface layer of the second resin substrate layer.

* * * * *